US009799749B1

(12) United States Patent
Bi et al.

(10) Patent No.: US 9,799,749 B1
(45) Date of Patent: Oct. 24, 2017

(54) VERTICAL TRANSPORT FET DEVICES WITH UNIFORM BOTTOM SPACER

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/240,056

(22) Filed: Aug. 18, 2016

(51) Int. Cl.
| | |
|---|---|
| *H01L 29/78* | (2006.01) |
| *H01L 21/02* | (2006.01) |
| *H01L 29/66* | (2006.01) |
| *H01L 29/16* | (2006.01) |
| *H01L 29/786* | (2006.01) |
| *H01L 29/06* | (2006.01) |
| *H01L 21/8238* | (2006.01) |
| *H01L 21/8234* | (2006.01) |

(52) U.S. Cl.
CPC .. *H01L 29/6656* (2013.01); *H01L 21/823487* (2013.01); *H01L 21/823885* (2013.01); *H01L 29/0676* (2013.01); *H01L 29/16* (2013.01); *H01L 29/66666* (2013.01); *H01L 29/785* (2013.01); *H01L 29/7827* (2013.01); *H01L 29/78642* (2013.01)

(58) Field of Classification Search
CPC ........... H01L 29/7827; H01L 29/66666; H01L 29/78642; H01L 27/2454; H01L 29/0676; H01L 29/785; H01L 29/6656; H01L 21/823885; H01L 21/823487
See application file for complete search history.

(56) References Cited

U.S. PATENT DOCUMENTS

| | | | |
|---|---|---|---|
| 5,641,698 A | 6/1997 | Lin | |
| 6,406,962 B1 | 6/2002 | Agnello et al. | |
| 6,642,566 B1 | 11/2003 | Mandelman et al. | |
| 8,530,866 B2* | 9/2013 | Abe ...................... | H01J 37/263 250/306 |
| 8,637,849 B2 | 1/2014 | Deligianni et al. | |
| 9,129,987 B2 | 9/2015 | Wan et al. | |
| 9,368,496 B1 | 6/2016 | Yu et al. | |
| 9,368,572 B1 | 6/2016 | Cheng et al. | |
| 9,385,195 B1* | 7/2016 | Zhang ................. | H01L 29/1033 |
| 9,530,866 B1* | 12/2016 | Zhang ............... | H01L 29/66666 |
| 9,536,793 B1* | 1/2017 | Zhang ............. | H01L 21/823828 |
| 2002/0060338 A1 | 5/2002 | Zhang | |
| 2011/0012085 A1* | 1/2011 | Deligianni ............. | B82Y 10/00 257/9 |
| 2011/0253981 A1* | 10/2011 | Rooyackers ........... | B82Y 10/00 257/24 |
| 2014/0206157 A1* | 7/2014 | Baldauf ............ | H01L 29/66666 438/156 |

(Continued)

*Primary Examiner* — Marvin Payen
*Assistant Examiner* — Jeremy Joy
(74) *Attorney, Agent, or Firm* — Cantor Colburn LLP; Vazken Alexanian

(57) ABSTRACT

Methods of fabrication and semiconductor structures includes vertical transport field effect transistors (VTFETs) having a uniform bottom spacer layer between different pattern density regions. The bottom spacer layer can be deposited by plasma vapor deposition.

15 Claims, 5 Drawing Sheets

(56) References Cited

U.S. PATENT DOCUMENTS

| | | | |
|---|---|---|---|
| 2014/0227858 A1* | 8/2014 | Shen | H01L 21/76224 |
| | | | 438/430 |
| 2014/0231919 A1* | 8/2014 | Peng | H01L 21/76224 |
| | | | 257/368 |
| 2015/0187867 A1 | 7/2015 | Basker et al. | |
| 2015/0364560 A1* | 12/2015 | Wang | H01L 29/42392 |
| | | | 257/288 |
| 2016/0049480 A1* | 2/2016 | Chang | H01L 29/41741 |
| | | | 257/369 |
| 2016/0079248 A1 | 3/2016 | Basker et al. | |
| 2016/0126142 A1 | 5/2016 | Chen et al. | |
| 2016/0163810 A1* | 6/2016 | Huang | H01L 29/42392 |
| | | | 257/329 |
| 2016/0211368 A1* | 7/2016 | Chen | H01L 29/7827 |
| 2016/0293602 A1* | 10/2016 | Liu | H01L 27/098 |

\* cited by examiner

VERTICAL TRANSPORT FET DEVICES WITH UNIFORM BOTTOM SPACER

BACKGROUND

The present invention relates to formation of fin-type field effect transistors (FinFETs), and more particularly, to vertical transport FinFETs including uniform bottom spacers.

Vertical Transport FETs (VTFET) are one of the promising alternatives to standard lateral FET structures due to benefits, among others, in terms of reduced circuit footprint. In this type of structure, the current flow is perpendicular to a supporting wafer, unlike the lateral current flow in FinFETs.

However, current deposition processes such as high density plasma chemical vapor deposition (HDPCVD) for the bottom spacer fabrication are sensitive to incoming pitch walking, which can cause high inter-fin spacer height variation, and in some instances, electron dissociation and ion bombardment can result in contamination diffusion into the vertical silicon fins. Additionally, the deposited dielectric typically contains hydrogen and carbon that can result in bottom spacer loss and variation during downstream processing.

SUMMARY

According to one or more embodiments of the present invention, a method for forming a semiconductor device includes conformally depositing an oxide liner layer onto a semiconductor substrate including an isolated fin region and/or a dense fin region, wherein the isolated fin region comprises individual vertically oriented fin structures having a hard mask disposed thereon, each one of the individual vertically oriented fin structures coupled to an individual bottom electrode formed in the semiconductor substrate and, and wherein the dense fin region comprises a plurality of vertically oriented fin structures coupled to a shared bottom electrode formed in the semiconductor substrate and the hard mask disposed thereon; depositing a bottom spacer layer onto the semiconductor substrate, wherein depositing the bottom spacer layer comprises a plasma vapor deposition process, and wherein the bottom spacer layer between the vertically oriented fin structures is at a height greater than the bottom spacer layer in an open region between isolated fin regions and/or dense fin regions; conformally depositing a second liner layer onto the semiconductor substrate; forming a planar flowable oxide layer on the semiconductor substrate to a top surface of the vertically oriented fin structures; removing a portion of the flowable oxide layer to the second liner layer between vertically oriented fin structures in the isolated fin region and/or the dense fin region, thereby exposing the second liner layer about portions of the sidewalls, between vertically oriented fin structures, and on the top surfaces of the vertically oriented fin structures in the isolated fin region and/or the dense fin region; removing the exposed second liner layer from the sidewalls, between vertically oriented fin structures, and the top surfaces of the vertically oriented fin structures in the isolated fin region and/or the dense fin region; and non-selectively removing a remaining portion of the flowable oxide, a portion of the bottom spacer layer between the vertically oriented fin structures, and the second liner layer stopping on the bottom spacer layer within the open region, wherein a thickness of the bottom spacer layer is equal in the open region and between the vertically oriented fin structures in the isolated fin region and/or the dense fin region.

In one or more embodiments, the method for forming a semiconductor device, the method includes providing a semiconductor substrate including vertically oriented fin structures at different pattern density regions, the vertically oriented fin structures defining an isolated fin region and/or a dense fin region, wherein the vertically oriented fin structures in the isolated fin region are each coupled to an individual bottom electrode, and wherein the vertically oriented fin structures in the dense fin region are each coupled to an shared bottom electrode, the vertically oriented fins structures including a hard mask disposed thereon; conformally depositing an oxide liner layer onto a semiconductor substrate; depositing a bottom spacer layer onto a bottom surface of the semiconductor substrate, wherein depositing the bottom spacer layer comprises a plasma vapor deposition process, wherein the bottom spacer layer between the vertically oriented fin structures is at a height greater than the bottom spacer layer in an open region between isolated fin regions and/or dense fin regions, and wherein the bottom spacer layer is a low k dielectric material; conformally depositing a second liner layer onto the semiconductor substrate; forming a planar flowable oxide layer on the semiconductor substrate to the second liner layer on top surfaces of the vertically oriented fin structures; removing a portion of the flowable oxide layer to the second liner layer between the vertically oriented fin structures, thereby exposing the second liner layer about portions of the sidewalls, between the vertically oriented fin structures, and the top surfaces of the vertically oriented fin structures; isotropically etching the exposed second liner layer from the sidewalls, between the vertically oriented fin structures, and the top surfaces of the vertically oriented fin structures, wherein removing the second liner layer between the vertically oriented fin structures exposes the bottom spacer layer therebetween; and non-selectively removing a remaining portion of the flowable oxide and the second liner layer stopping on the bottom spacer layer within an open region, wherein stopping on the bottom spacer layer within the open region removes a portion of the bottom spacer layer between the vertically oriented fin structures such that a thickness of the bottom spacer layer is equal in the open region and between the vertically oriented fin structures at the different pattern densities.

A semiconductor structure includes an isolated fin region and/or a dense fin region, wherein the isolated fin region includes individual vertically oriented fin structures, each one of the individual vertically oriented fin structures coupled to individual top and bottom electrodes, and wherein the dense fin region includes a plurality of vertically oriented fin structures coupled to shared top and bottom electrodes; a bottom spacer overlying the individual and shared bottom electrodes, wherein the bottom spacer has a uniform thickness between the vertically oriented fin structures in the isolated fin region and/or dense fin region and in open regions between the isolated fin regions and/or dense fin regions; and a top spacer underlying the individual and shared top electrodes; and a gate intermediate the bottom and top spacers.

DETAILED DESCRIPTION

Figure 1:
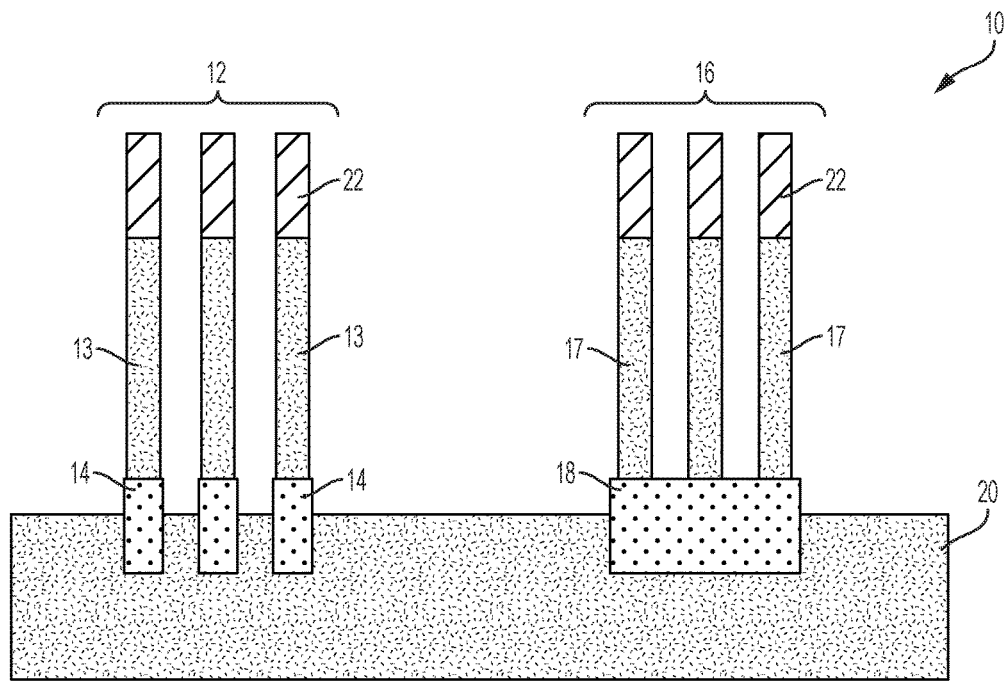
FIG. 1 depicts a cross sectional view of a semiconductor structure including isolated and dense vertically oriented fin structures in accordance with one or more embodiments.

The present invention is generally directed to bottom spacer formation in a vertical transport field effect transistor (VTFET). Currently, the bottom spacer is typically fabricated by a high density plasma chemical vapor deposition (HDPCVD) process. HDPCVD is a directional (bottoms-up) process that is used for high aspect ratio gap-fill and accomplishes this by directing charged dielectric precursor species downward to the bottom of the gap.

As noted in the background, the HDPCVD process has a relatively fast bottom-up growth compared to sidewall growth but can lead to interfin spacer variation at amounts typically greater than 2 nanometers (nm) during fabrication of semiconductor structures including VTFETs of different patterning density regions. In addition, HDPCVD utilizes precursors that typically include carbon and/or hydrogen, e.g., $SiH_4$ for deposition of silicon containing dielectrics, which are known to create spacer variations during downstream processing such as during a BHF high k dielectric pre-clean step, for example. Moreover, when fluorine is used a component of a precursor, e.g., SiF4, $NF_3$ or the like, the ion bombardment in HDPCVD can cause fluorine ion diffusion into the fins, which can affect device mobility, stability, and the like. The present process and resulting structure utilizes a highly direction plasma vapor deposition and fabrication process to provide a uniform bottom spacer in both interfin and non-fin regions, i.e., between different patterning density regions.

Although there are some differences in the way various HDPCVD systems are designed, from the type of plasma source used to the way the reaction chamber is cleaned, all work in fundamentally the same way. Each functions to provide a simultaneous deposition and etching action. Etching action is needed to remove sidewall deposits and tophats. A high-density plasma source—inductively coupled plasma (ICP), electron cyclotron resonance (ECR) or Helicon, for example—excites a gas mixture that includes, for example, oxygen and argon. Source power is typically in the range of about 2000 to about 3000 W, but any suitable power can be used provided the gas mixture is sufficiently excited to conduct HDPCVD. A magnetic field can be applied to the substrate, but it is not necessary. In some methods, two or more different bias powers can be applied to the substrate to pull the energetic ions out of the plasma and direct them at the substrate surface: the oxygen, for example, reacts with silane (SiH4) to form $SiO_2$, while the argon acts to sputter deposited material away. In other methods, a fluorine species, such as $NF_3$, is used between dielectric film deposition steps to etch the film. Typically, a 13.56 MHz RF source is used to apply a bias voltage between the substrate and the plasma, but any particular RF frequency can be used. Furthermore, the process can also be carried out using two or more different source powers and constant bias power or in conjunction with two or more different bias powers.

The ICP or other high-density plasma source maintains a high ion density even at the relatively low pressures (e.g., a few mTorr) needed to obtain the directionality required for tailoring the spacer for desired applications (at higher pressures, there are too many collisions between radicals to maintain good directionality). The etch/deposition (E:D) ratio—typically kept in the range of between 0.14-0.33—is controlled by the ratio of the gases, the chamber pressure, and the RF bias on the substrate. The reaction chamber pressures are controlled in the range of from about 0.1 millitorr (mTorr) to about 100 millitorr.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the disclosed structures, as they are oriented in the drawing figures. The same numbers in the various figures can refer to the same structural component or part thereof.

Turning now to FIG. 1, there is shown a cross section of an exemplary incoming semiconductor structure 10 suitable for forming a uniform bottom spacer and completing fabrication of semiconductor structure including one or more VTFETs in accordance with one or more embodiments. The incoming semiconductor structure 10 includes conventionally and partially fabricated vertical transport field effect transistors (VTFETs), which can include single fin regions 12, wherein each fin 13 is coupled to a separate bottom electrode region 14 (i.e., drain region) and/or multiple fin regions 16, wherein each fin 17 is coupled to a common bottom electrode region 18. The single fin regions 12 as well as the multiplefin regions 16 are not intended to be limited. More or less single and/or multiple fin regions 12, 16, respectively, can be present on a given semiconductor structure. Likewise, the number of individual fins in each region 12 or 16 is not intended to be limited to the three fins 13, 17, respectively, shown. The fins 13, 17 are vertically oriented with respect to a substrate 20. As will be discussed in greater detail below, the fins 13 in the single fin regions 12 are used to fabricate individual VTFETs on the substrate, i.e., single fin transistors, and the fins 17 in the multiple regions 16 are used to fabricate a multiple fin transistor sharing the same source and drain regions. A hard mask 22 is shown remaining on a top surface of each one of the fins in the incoming structure 10.

The fins 13, 17 in the single fin and multiple fin regions 12, 16, respectively, are generally formed of silicon.

The bottom electrode regions 14, 18 (e.g., drain regions as well as the source regions for the completed VTFETs) can be formed by an epitaxial growth process that deposits a crystalline semiconductor material onto selected areas of the substrate 20 to form the drain region 14, 18.

The epitaxial growth process can include epitaxial materials grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^3$, or, in other embodiments, between $2\times10^{20}$ cm$^{-3}$ to $1\times10^{21}$ cm$^3$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The substrate 20 can include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 20 can also comprise an organic semiconductor or a layered semiconductor such as, for example, Si/SiGe, a silicon-on-insulator or a SiGe-on-insulator. A portion or entire semiconductor substrate 102 can be amorphous, polycrystalline, or monocrystalline. In addition to the aforementioned types of semiconductor substrates, the semiconductor substrate employed in the present invention can also comprise a hybrid oriented (HOT) semiconductor substrate in which the HOT substrate has surface regions of different crystallographic orientation. The semiconductor substrate 20 can be doped, undoped or contain doped regions and undoped regions therein. The semiconductor substrate can contain regions with strain and regions without strain therein, or contain regions of tensile strain and compressive strain.

The hardmask 22 can include, for example, silicon oxide, silicon nitride (SiN), or any suitable combination of those. The hardmask 22 can be deposited using a deposition process, including, but not limited to, PVD, CVD, PECVD, or any combination thereof.

Figure 2:
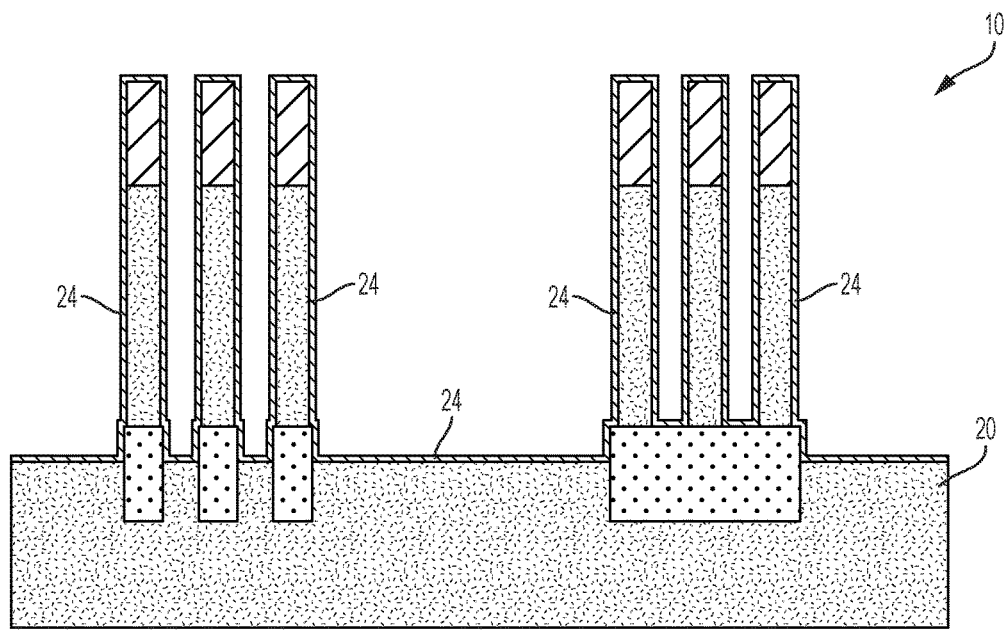
FIG. 2 depicts a cross sectional view of the semiconductor structure of FIG. 1 subsequent to conformal deposition of an oxide liner layer in accordance with one or more embodiments.

In FIG. 2, an oxide layer 24 is conformally deposited onto the incoming semiconductor structure 10. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 3:
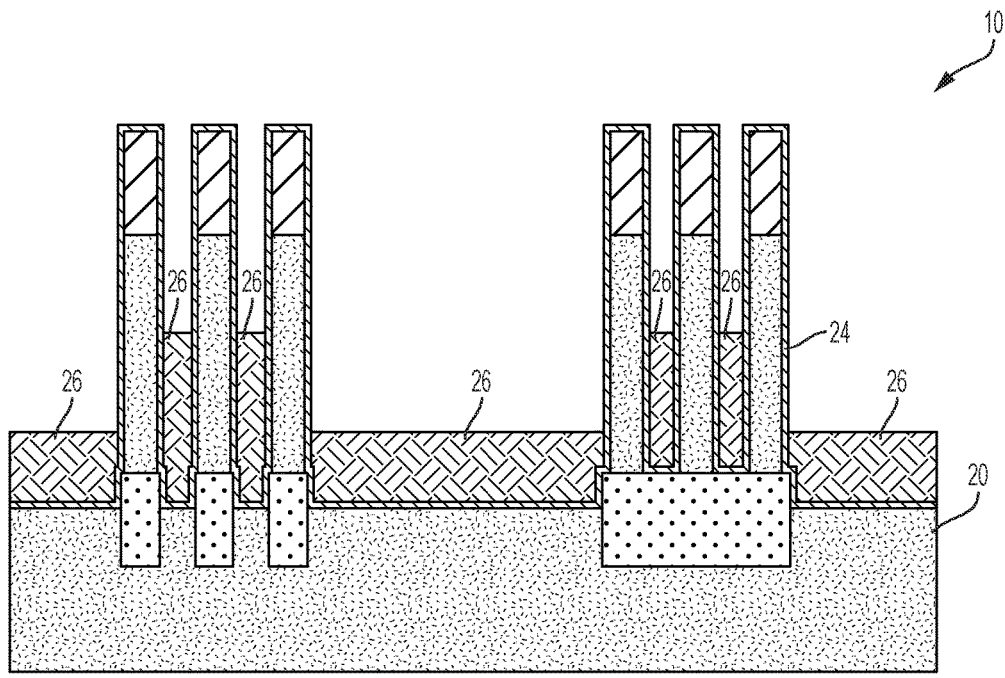
FIG. 3 depicts a cross sectional view of the semiconductor structure of FIG. 2 subsequent to plasma vapor deposition of a bottom spacer layer in accordance with one or more embodiments.

In FIG. 3, a bottoms up spacer layer 26 is deposited by plasma vapor deposition (PVD). Unlike the prior art HDP-CVD processes to deposit the bottom spacer layer and etch the sidewalls, the PVD process is highly directional and deposits the spacer onto the bottom of the trenches but not on fin sidewall. PVD only uses physical forces to deposit the layer while HDP-CVD uses chemical processes with the attendant problems discussed above. In PVD, a pure source material is gasified via evaporation, the application of high power electricity, laser ablation, or the like. The gasified material will then condense on the substrate material to create the desired layer. There are no chemical reactions that take place in the entire process.

The bottom spacer 26 is a low k dielectric material. The term "low k dielectric" generally refers to an insulating material having a dielectric constant less than silicon dioxide, i.e., less than 3.9. Exemplary low k dielectric materials include, but are not limited to, dielectric nitrides (e.g., silicon nitride, SiBCN), dielectric oxynitrides (e.g., SiOCN), or any combination thereof or the like.

As shown, the bottom spacer layer disposed between the vertically oriented fin structures is at a height (i.e., thickness) greater than the bottom spacer layer in an open region between fin regions as a result of the PVD deposition process.

Figure 4:
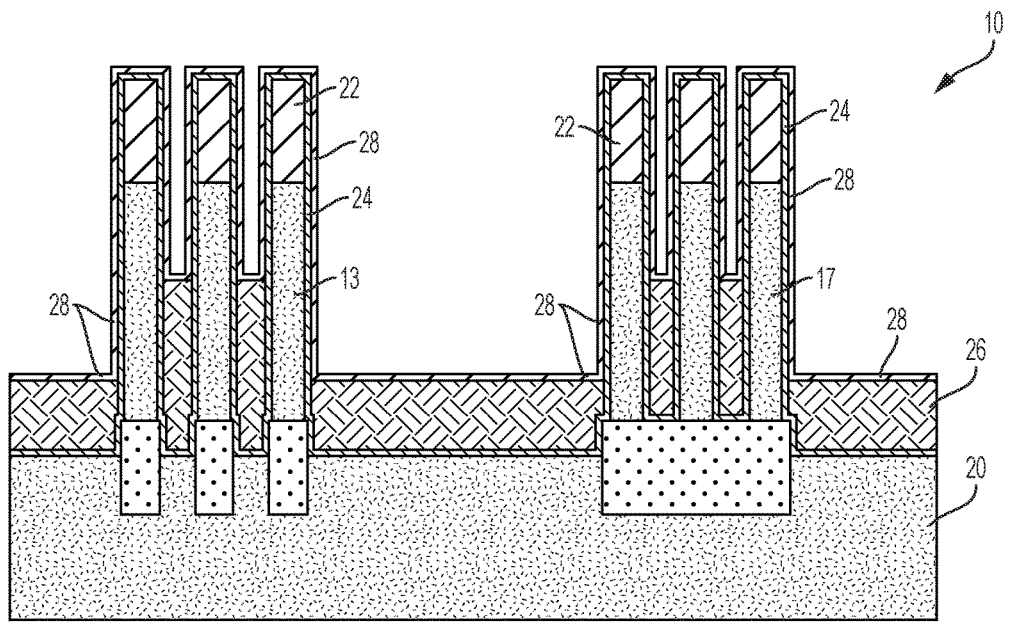
FIG. 4 depicts a cross sectional view of the semiconductor structure of FIG. 3 subsequent to deposition of a second liner layer in accordance with one or more embodiments.

FIG. 4 depicts the semiconductor structure 10 subsequent to conformal deposition of a liner layer 28 onto the exposed surfaces of the PVD deposited bottom spacer layer 26 and the exposed surfaces of the oxide liner layer 24 about the fins 13, 17 and hardmask 22.

Figure 5:
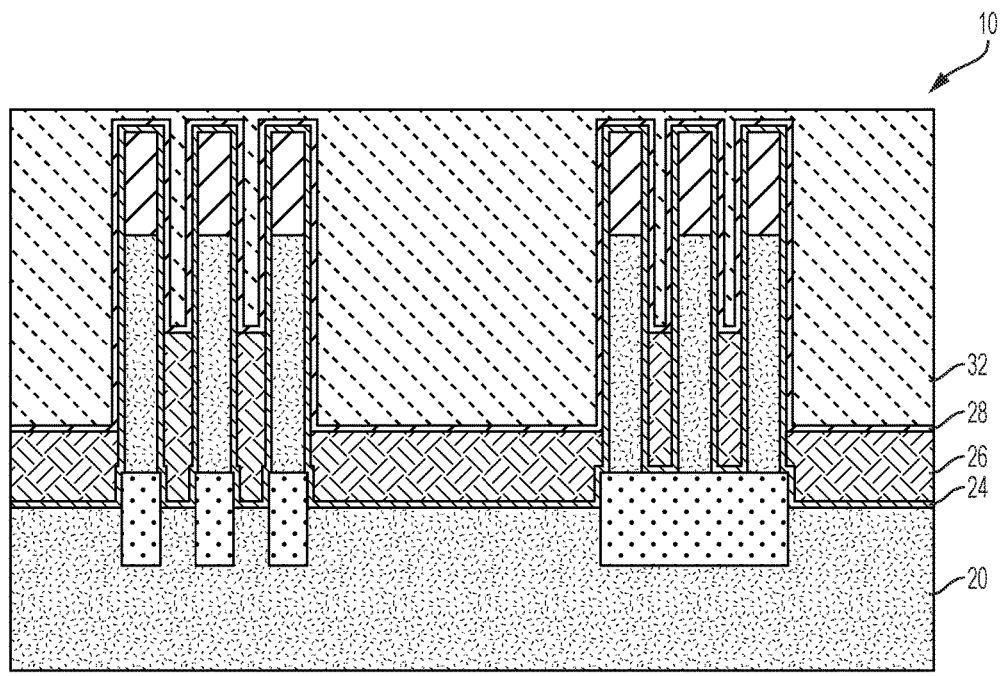
FIG. 5 depicts a cross sectional view of the semiconductor structure of FIG. 4 subsequent to deposition of a flowable oxide and a chemical mechanical polishing planarization step in accordance with one or more embodiments.

FIG. 5 depicts the semiconductor structure 10 subsequent to deposition of a flowable oxide 32 followed by a chemical mechanical polishing (CMP) planarization step to about an uppermost surface of the so-formed fin structure. The flowable oxide 32 deposited on the substrate 20 typically contains some combination of Si—O, Si—H and Si—OH bonds and flowable during formation. Suitable flowable oxides and deposition processes are described in U.S. Pat. No. 8,318,584 to Applied Materials, Inc., the contents of which are incorporated by reference in its entirety. Optionally, the flowable oxide 32 can be a spin-on oxide dielectric. By way of example, the flowable oxide can be a flowable undoped oxide, a carbon doped flowable oxide, or the like.

Figure 6:
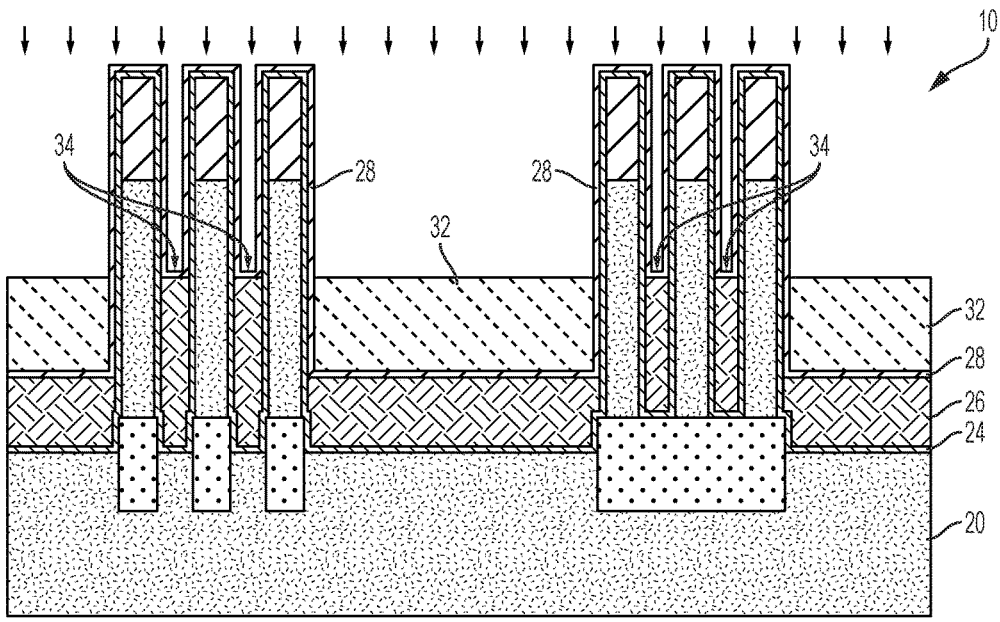
FIG. 6 depicts a cross sectional view of the semiconductor structure of FIG. 5 subsequent to an anisotropic etch to remove a portion of the flowable oxide to the second liner layer between the vertically oriented fin structures in accordance with one or more embodiments.

FIG. 6 depicts the semiconductor structure 10 subsequent to a highly directional anisotropic etch process to the interfin local liner layer as indicated by arrow 34 so as to remove a portion of the flowable oxide layer 32. Suitable directional etch processes for top down recess stop on the local interfin liner layer includes gas cluster ion beam (GCIB) processes.

Figure 7:
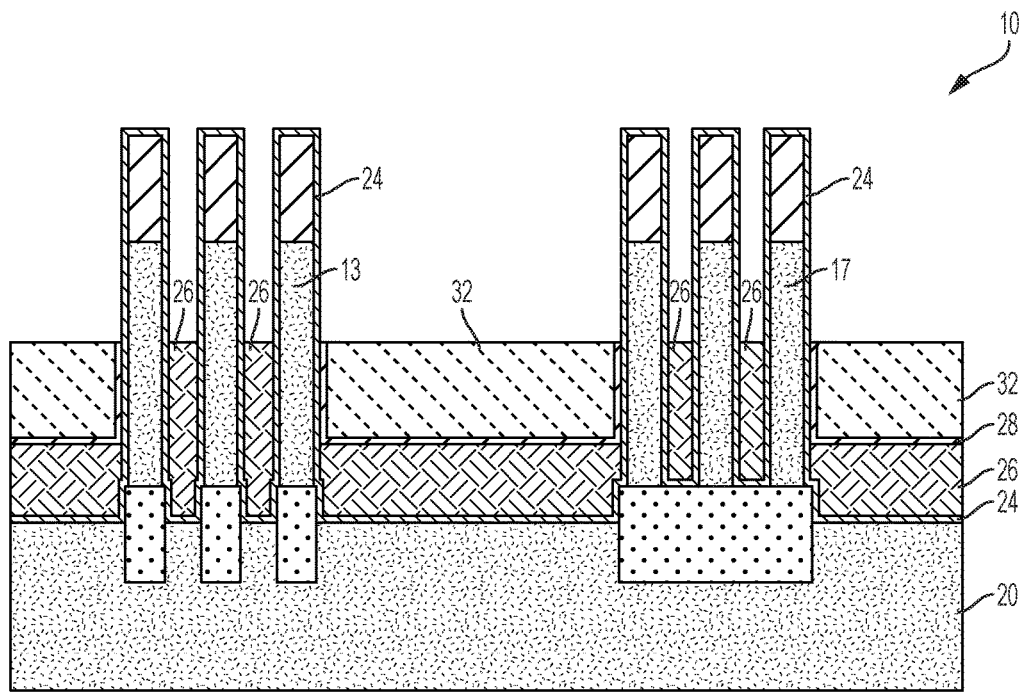
FIG. 7 depicts a cross sectional view of the semiconductor structure of FIG. 6 subsequent to removal of the exposed second liner layer in accordance with one or more embodiments.

In FIG. 7, an isotropic etch process is them performed to the oxide layer 24 to remove the exposed liner layer 28 on the sidewalls, between the vertically oriented fin structures, and the top surfaces of the fin structures 13, and 17, thereby exposing the interfin bottom spacer layer 26. Removing the second liner layer from between the vertically oriented fin structures exposes the bottom spacer layer therein, which is at a height greater than the bottom spacer layer in the open regions.

Figure 8:
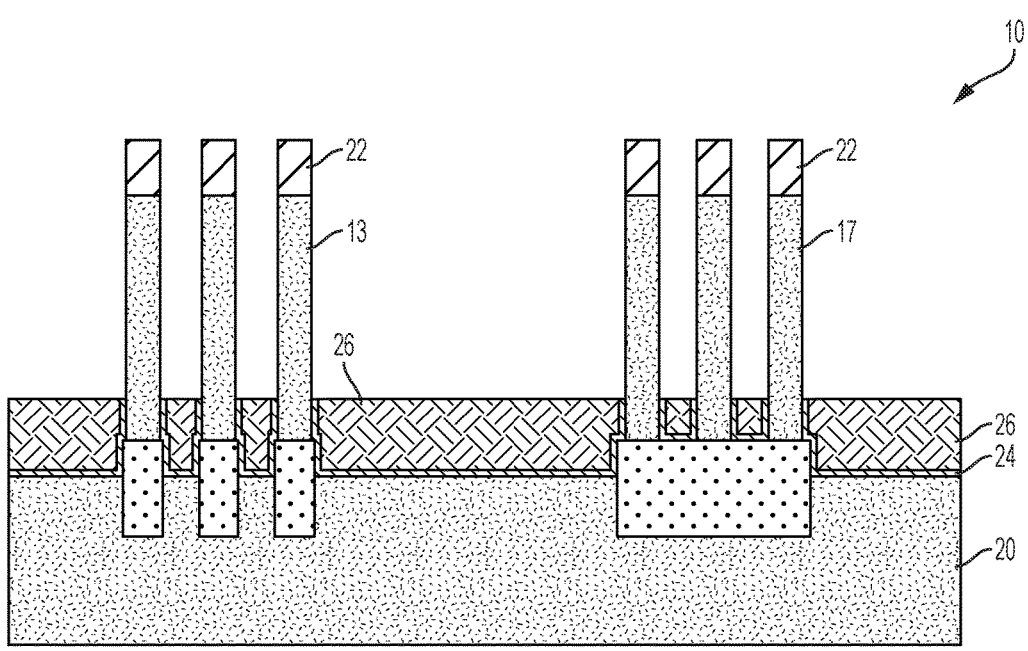
FIG. 8 depicts a cross sectional view of the semiconductor structure of FIG. 7 subsequent to removal of the remaining flowable oxide, the second liner layer, and a portion of the bottom spacer layer in accordance with one or more embodiments.

In FIG. 8, a non-selective oxide etch is then performed to stop on the bottom spacer layer 26 in the open region to remove the remaining portion of the flowable oxide, the second liner layer and a portion of the bottom spacer layer between the vertically oriented fin structures. The portion of the bottom spacer layer removed is to the second liner layer in the open region. As such, removal of the portion of the bottom spacer layer provides an equal thickness to the bottom spacer layer in between the vertically oriented fin structures and the open regions. Suitable non-selective etch processes include reactive ion etch (RIE). Optionally, a highly directional etch process such as GCIB can be used to remove the remaining portion of the flowable oxide, the second liner layer, and a portion of the bottom spacer layer between the vertically oriented fin structures so as to provide the semiconductor structure with a bottom spacer layer having a uniform thickness regardless of the presence of different pattern density regions. That, is, the thickness is the same for both the open regions and between individual fin structures. Suitable processes for selectively removing the liner layer includes GCIB.

Figure 9:
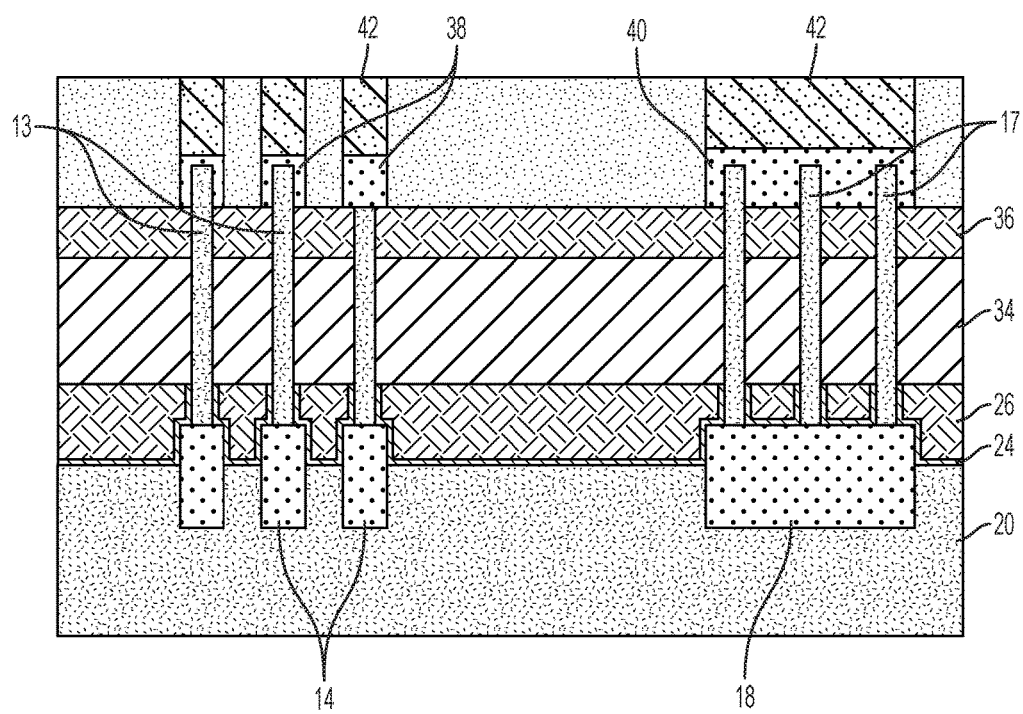
FIG. 9 depicts a cross sectional view of the semiconductor structure of FIG. 8 subsequent to additional processing to form a vertical transport field effect transistor including a bottom spacer layer having a uniform thickness in different pattern density regions in accordance with one or more embodiments.

Conventional downstream processes can then occur to complete fabrication of the VTFETs in the semiconductor structure 10 as shown in FIG. 9, which generally includes forming the gate dielectric layer 34, the top spacer layer 36, the respective top electrodes 38, 40 (i.e., source regions) for the isolated fin regions 12 and the dense fin regions 16, respectively, and the metal contacts 42 coupled thereto. Advantageously, the bottom spacer layer 26 has a uniform thickness between different patterning density regions.

The gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) can be disposed over the gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

After the devices are formed, additional insulating material can be deposited over the device(s). The insulating material can be patterned to form cavities that expose portions of the source/drain regions and the gate stack contacts. The cavities can be filled by a conductive material to form the metal contacts and, in some embodiments, a liner layer (not shown) to form conductive contacts.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    conformally depositing an oxide liner layer onto a semiconductor substrate comprising an isolated fin region and/or a dense fin region, wherein the isolated fin region comprises individual vertically oriented fin structures having a hard mask disposed thereon, each one of the individual vertically oriented fin structures coupled to an individual bottom electrode formed in the semiconductor substrate, and wherein the dense fin region comprises a plurality of vertically oriented fin structures coupled to a shared bottom electrode formed in the semiconductor substrate and the hard mask disposed thereon;
    depositing a bottom spacer layer onto the semiconductor substrate, wherein depositing the bottom spacer layer comprises a plasma vapor deposition process, and wherein the bottom spacer layer between the vertically oriented fin structures is at a height greater than the bottom spacer layer in an open region between isolated fin regions and/or dense fin regions;
    conformally depositing a second liner layer onto the semiconductor substrate;
    forming a planar flowable oxide layer on the semiconductor substrate to a top surface of the vertically oriented fin structures;
    removing a portion of the flowable oxide layer to the second liner layer between vertically oriented fin structures in the isolated fin region and/or the dense fin region, thereby exposing the second liner layer about portions of the sidewalls, between vertically oriented fin structures, and on the top surfaces of the vertically oriented fin structures in the isolated fin region and/or the dense fin region;
    removing the exposed second liner layer from the sidewalls, between vertically oriented fin structures, and the top surfaces of the vertically oriented fin structures in the isolated fin region and/or the dense fin region; and
    non-selectively removing a remaining portion of the flowable oxide, a portion of the bottom spacer layer between the vertically oriented fin structures, and the second liner layer stopping on the bottom spacer layer within the open region, wherein a thickness of the bottom spacer layer is equal in the open region and between the vertically oriented fin structures in the isolated fin region and/or the dense fin region.

2. The method of claim 1, wherein the bottom spacer layer comprises a carbon doped oxide, a nitride, an oxynitride, or combinations thereof.

3. The method of claim 1, wherein the bottom spacer layer is SiBCN.

4. The method of claim 1, wherein conformally depositing an oxide liner layer comprises an atomic layer deposition process.

5. The method of claim 1, wherein the oxide liner layer is silicon dioxide.

6. The method of claim 1, wherein non-selectively removing the remaining portion of the flowable oxide and the second liner layer comprises a reaction ion etch process.

7. The method of claim 1, wherein removing the remaining portion of the flowable oxide and the second liner layer comprises a gas cluster ion beam process.

8. The method of claim 1, wherein the second liner layer is a nitride.

9. The method of claim 1, further comprising removing the hard mask, forming a gate on the bottom spacer layer adjacent the vertically oriented fin structures; forming a top spacer on the gate; and forming top electrodes onto each one of the individual vertically oriented fin structures coupled to the individual bottom electrode to form the isolated fin region, and forming a shared top electrode onto the plurality of vertically oriented fin structures coupled to the shared bottom electrode.

10. A method for forming a semiconductor device, the method comprising:
    providing a semiconductor substrate comprising vertically oriented fin structures at different pattern density regions, the vertically oriented fin structures defining an isolated fin region and/or a dense fin region, wherein the vertically oriented fin structures in the isolated fin region are each coupled to an individual bottom electrode, and wherein the vertically oriented fin structures in the dense fin region are each coupled to an shared bottom electrode, the vertically oriented fins structures including a hard mask disposed thereon;
    conformally depositing an oxide liner layer onto a semiconductor substrate;
    depositing a bottom spacer layer onto a bottom surface of the semiconductor substrate, wherein depositing the bottom spacer layer comprises a plasma vapor deposition process, wherein the bottom spacer layer between the vertically oriented fin structures is at a height greater than the bottom spacer layer in an open region between isolated fin regions and/or dense fin regions, and wherein the bottom spacer layer is a low k dielectric material;
    conformally depositing a second liner layer onto the semiconductor substrate;
    forming a planar flowable oxide layer on the semiconductor substrate to the second liner layer on top surfaces of the vertically oriented fin structures;
    removing a portion of the flowable oxide layer to the second liner layer between the vertically oriented fin structures, thereby exposing the second liner layer about portions of the sidewalls, between the vertically oriented fin structures, and the top surfaces of the vertically oriented fin structures;
    isotropically etching the exposed second liner layer from the sidewalls, between the vertically oriented fin structures, and the top surfaces of the vertically oriented fin structures, wherein removing the second liner layer between the vertically oriented fin structures exposes the bottom spacer layer therebetween; and non-selectively removing a remaining portion of the flowable oxide and the second liner layer stopping on the bottom spacer layer within an open region, wherein stopping on the bottom spacer layer within the open region removes a portion of the bottom spacer layer between the vertically oriented fin structures such that a thickness of the bottom spacer layer is equal in the open region and between the vertically oriented fin structures at the different pattern densities.

11. The method of claim 10, wherein conformally depositing the oxide liner layer onto the semiconductor substrate comprises atomic layer deposition.

12. The method of claim 10, wherein the bottom spacer layer is SiBCN.

13. The method of claim 10, wherein the second liner layer is a nitride.

14. The method of claim 10, wherein removing the remaining portion of the flowable oxide and the second liner layer comprises a non-selective reaction ion etch process or a selective gas cluster ion beam process.

15. The method of claim 10, further comprising removing the hard mask, forming a gate on the bottom spacer layer adjacent the vertically oriented fin structures; forming a top spacer on the gate; and forming top electrodes onto each one of the individual vertically oriented fin structures coupled to the individual bottom electrode to form the isolated fin region, and forming a shared top electrode onto the plurality of vertically oriented fin structures coupled to the shared bottom electrode.

* * * * *